(12) United States Patent
Graham

(10) Patent No.: US 6,914,435 B2
(45) Date of Patent: Jul. 5, 2005

(54) CIRCUIT FOR MEASUREMENT OF ELECTRICAL POLLUTION ON POWER LINE

(75) Inventor: Martin H. Graham, Berkeley, CA (US)

(73) Assignee: And Yet, Inc., Berkeley, CA (US)

( * ) Notice: Subject to any disclaimer, the term of this patent is extended or adjusted under 35 U.S.C. 154(b) by 0 days.

(21) Appl. No.: 10/677,973

(22) Filed: Oct. 1, 2003

(65) Prior Publication Data

US 2005/0073316 A1 Apr. 7, 2005

(51) Int. Cl.$^7$ .............................................. G01R 31/00
(52) U.S. Cl. ......................................... 324/500; 324/522
(58) Field of Search .............................. 324/500, 522, 324/537, 158; 340/566; 379/100.01

(56) References Cited

U.S. PATENT DOCUMENTS

| | | | | |
|---|---|---|---|---|
| 3,876,837 A | * | 4/1975 | Gormley et al. | ....... 379/100.01 |
| 4,755,801 A | * | 7/1988 | Gooley | ....................... 340/566 |

* cited by examiner

*Primary Examiner*—Vincent Q. Nguyen
(74) *Attorney, Agent, or Firm*—Blakely, Sokoloff, Taylor & Zafman, LLP

(57) ABSTRACT

A circuit and method for measuring pollution on an AC power line is described. After attenuation of the AC power signal, the remaining signal is differentiated, rectified and smoothed to provide a DC signal representative of the pollution which can be viewed on an ordinary meter.

15 Claims, 1 Drawing Sheet

CIRCUIT FOR MEASUREMENT OF ELECTRICAL POLLUTION ON POWER LINE

FIELD OF THE INVENTION

The invention relates to the measurement of pollution on power lines.

PRIOR ART

In a typical alternating current (AC) power line undesirable pollution often occurs. This pollution, by way of example, can be caused by a switched power supply, motors, and appliances that propagate high frequency signals onto the line that can be radiated. It is desirable to know the magnitude of this pollution to determine, for instance, how to remove it.

One way of measuring power line pollution is to use a spectrum analyzer which examines high frequency components in the power line signal. Such equipment is not only expensive but requires a skilled operator.

Ideally, the pollution should be measured with an inexpensive apparatus which may be operated without requiring training.

SUMMARY OF THE INVENTION

A circuit for use in measuring pollutions on a power line is described. A filter first attenuates the power line signal, for example, a 50 Hz or 60 Hz signal. The output of the filter is then differentiated to provide a signal more representative of the pollution. This signal is coupled to an amplifier with a feedback path. The components in the feedback path cause the signal at the output of the amplifier to be rectified and averaged. The output of the amplifier may then coupled to an ordinary meter.

DETAILED DESCRIPTION

Figures 1, 2:
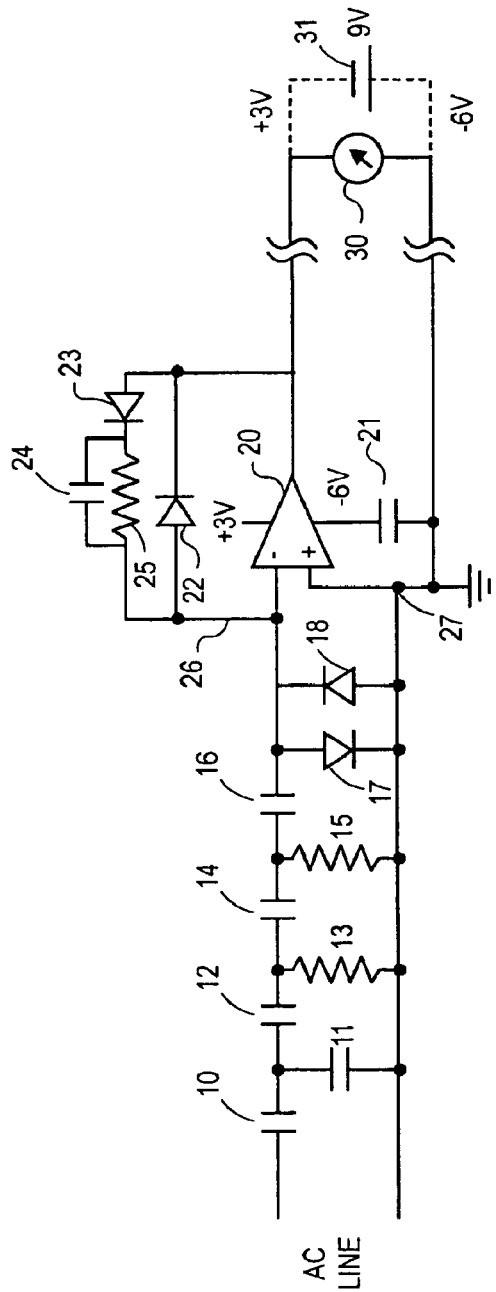
FIG. 1 is an electrical schematic of an embodiment of the present invention.
FIG. 2 is a table setting forth values and part numbers for the components of the circuit of FIG. 1 for one embodiment of the present invention.

A circuit for use in measuring pollution on a power line is described. In the following description, numerous specific details are set forth such as specific components and component values. It will be apparent to one skilled in the art that the present invention may be practiced without these specific details.

As mentioned earlier, to measure electrical pollution on a power line, a spectrum analyzer can be used to examine the various high frequency components in the power line. This is not an easy task, and typically requires relatively expensive equipment. For example, a harmonic of the power signal at 240 Hz of a certain magnitude is not as significant as a signal at 100 KHz of the same magnitude. Some judgment may be required to interpret the pollution.

It has been determined that if the power line signal is differentiated, the polluting components are better highlighted and can be more meaningfully dealt with. In fact, once differentiated, and after the fundamental frequency of the power signal is substantially attenuated, the resultant differentiated signal can be rectified and averaged and coupled to an ordinary meter for reading. The reading on the meter represents, in a single value, a meaningful representation of the power line pollution without the requirement of examining each of the components at various frequencies.

As will be seen, the circuit described below performs this very task. Moreover, the circuit is relatively inexpensive to fabricate and can be used with an ordinary meter, purchased at, for instance, Radio Shack or other consumer outlets. The circuit also can be built into an inexpensive meter.

Referring now to FIG. 1, the circuit includes a pair of terminals coupled to the AC line. The AC signal is first coupled to a voltage divider comprising capacitors 10 and 11 to reduce the AC line potential by, for example, $1/10^{th}$. While, as shown in FIG. 1, a capacitive voltage divider is used, the voltage divider can be fabricated from a pair of resistors or other voltage divider circuits used, or it may be omitted.

The potential across the capacitor 11 which is, as mentioned, approximately $1/10^{th}$ the AC line potential, for one embodiment, is coupled to a filter which substantially attenuates the fundamental frequency of the power line signal. Typically, the filter provides a high impedance at, for example 50 or 60 cycles, and significantly less impedance at higher frequencies. In the circuit of FIG. 1, two sections of an RC filter are used. One section comprises the capacitor 12 and resistor 13, and the second section, the capacitor 14 and the resistor 15. Other filtering arrangements, including active filters or filters using inductors, may be employed for passing the high frequency components and attenuating the actual power line signal.

The output of the filter, that is, the potential across the resistor 15, is coupled to a capacitor 16. This relatively small capacitor, provides a high impedance, and as will be discussed, substantially differentiates the signal at the output of the filter. The differentiated signal is then coupled to the negative input terminal 26 of an operational amplifier (OP amp) 20. The positive input terminal 27 of OP amp 20 is coupled to ground. This ground node is common with one line of the AC power lines. In one embodiment, as will be discussed, this ground is not common with the OP amp power supply nor the meter coupled to the circuit of FIG. 1.

A pair of parallel diodes 17 and 18 are coupled across the terminals 26 and 27 of the OP amp 20. The polarity of the diodes are reversed. These diodes conduct whenever the signal across these terminals exceeds a predetermined value, for instance, 0.8 volts. These diodes provide input protection to the amplifier and prevent a meter attached to the circuit from being overdriven or damaged by, for example, a large spike in the AC power line. The potential which may be applied to the amplifier before these diodes conduct is sufficient, as will be discussed, to cause a full scale deflection on the meter coupled to the circuit in at least one range of the meter.

A feedback path is coupled between the output of the OP amp 20 and the negative input terminal 26. This feedback path includes the parallel combination of the capacitor 24 and the resistor 25. Additionally, the feedback path includes the diode 23, coupled in series with the resistor 25 and capacitor 24 and the diode 22, coupled directly across the output terminal and the negative input terminal 26 of the OP amp 20. Note that diodes 22 and 23 are oriented in opposite directions between the input and the output of the OP amp.

The combination of the capacitor 24 and resistor 25 are used to average the signal passed through the OP amp 20. The values of these components are selected so that the RC time constant causes the signals at the output of the amplifier to be smoothed into a single DC signal. Additionally, the value of the capacitor 24, when considered in connection with capacitors 10, 12, 14 and 16, determines the overall high frequency gain of a circuit.

The diodes 22 and 23 rectify what would otherwise be negative and positive going pulses at the output of the OP amp 20. Thus, the output of the OP amp 20 is a DC signal representing both the positive and negative excursions of the signal applied to terminal 26.

In one embodiment, the output of the circuit of FIG. 1, that is the output of the OP amp 20, is coupled to an ordinary meter 30. The meter 30, which may be a commercially available meter, includes a 9-volt battery 31. This battery can be coupled to the power supply terminals of the OP amp 20 to supply power to the circuit of FIG. 1. The connection to the OP amp 20 is shown as +3 volts and −6 volts. The terminal of the battery shown as having −6 volts, is coupled to the common ground through the capacitor 21.

In operation, an AC signal is applied across the voltage divider comprising the capacitors 10 and 11. About $\frac{1}{10}^{th}$ of the input voltage is coupled to the filter sections comprising the capacitors 12 and 14, and resistors 13 and 15. Here, because of the relative values of the capacitors and resistors as shown in FIG. 2, substantially more attenuation occurs at 60 Hz than at higher frequencies. The signal coupled to the capacitor 16 is differentiated by the capacitor 16. This capacitor has relatively low capacitance (see FIG. 2). The effect of passing the signal through the capacitor 16 is that the current at terminal 26 is equal to C dv/dt. The input impedance to the OP amp 20 is very high since field effect transistors are used in one embodiment for the input stage of the OP amp 20. In one embodiment the OP amp has a bandwidth of 100 KHz. A wider bandwidth can be used. The capacitor 24 and the resistor 25, along with the diodes 22 and 23, rectify and smooth the signal at the terminal 26 to provide a DC level at the output of the OP amp 20.

By way of example, for one ordinary meter, the output of the OP amp 20 is coupled to the DC voltage, input terminal of the meter. Full scale deflections can be obtained when the range of the meter is set to the 200 or 2000 mV range when sufficient pollution is present. The values shown in FIG. 2 are used for the circuit of FIG. 1. Additionally, less than full scale deflections occur in the 20V range.

While a meter is discussed to provide a visual indication of the electrical pollution, other indicators can be used. By way of example, several lights or LEDs can be used to indicate the level of pollution. In another embodiment, the output of the circuit can be coupled to a recorder to provide a time-of-day indication of when pollution occurred. Also, a tone or tones of different volumes may also be used.

Thus, a circuit has been described for allowing for the measurement of pollution on a power line. The circuit can be fabricated using ordinary components which are relatively inexpensive.

What is claimed is:

1. A circuit for use in measuring pollution on a power line comprising:
   a filter for attenuating a power line signal, coupled to the power line;
   a differentiator coupled to the filter;
   an amplifier having an input coupled to the differentiator; and
   a feedback path coupled between an output of the amplifier and its input having a parallel, coupled resistor and capacitor for averaging the output of the amplifier and a rectifier, such that the output of the amplifier is a DC signal.

2. The circuit defined by claim 1, wherein the differentiator is a capacitor.

3. The circuit defined by claim 1, including input protection coupled at the input to the amplifier.

4. The circuit defined by claim 3, wherein the input protection comprises parallel diodes with their polarities reversed.

5. The circuit defined by claim 1, wherein the amplifier is an OP amplifier.

6. The circuit defined by claim 5, wherein the feedback path is coupled between the output of the OP amplifier, and a negative input terminal of the OP amp.

7. The circuit defined by claim 1, including a meter coupled to the output of the amplifier.

8. The circuit defined by claim 1, including means for providing a perceptible indication of the DC signal at the output of the amplifier.

9. The circuit defined by claim 8, including a voltage divider for reducing the line voltage before it is coupled to the filter.

10. The circuit defined by claim 1, including a meter coupled to the output of the amplifier, the meter including a battery having a pair of terminals, the pair of terminals being coupled to power the amplifier, one of the terminals being capacitively coupled to a ground common with a line of the power line signal.

11. A circuit for use in measuring pollution on a power line comprising:
    a filter for attenuating the fundamental frequency of the power line signal;
    a capacitor coupled to the filter for differentiating the output signal from the filter;
    an operational amplifier (OP amp) having a negative terminal coupled to the capacitor, an output of the OP amp being coupled to the negative terminal of the OP amp through a feedback path which includes a rectifier and a parallel combination of a resistor and a capacitor having an RC time constant, the RC time constant and rectifier to cause the output of the OP amp to be a DC signal.

12. The circuit defined by claim 11, including a voltage divider for reducing the AC line potential before it is coupled to the filter.

13. The circuit defined by claim 12, including a pair of parallel diodes connected with their polarities reversed disposed between the negative terminal and a positive terminal of the OP amp for limiting the amplitude of the signal applied to the OP amp.

14. The circuit defined by claim 13, including a meter coupled to the output of the OP amp.

15. A method for measuring pollution on a power line comprising:
    sensing a power line signal and a polluting signal on the power line;
    attenuating the sensed power line signal;
    differentiating the signal remaining from the attenuation;
    averaging the differentiated signal so as to obtain a signal representative of the pollution of the power line; and
    displaying the averaged signal.

* * * * *